United States Patent
Sato et al.

(10) Patent No.: US 6,512,233 B1
(45) Date of Patent: Jan. 28, 2003

(54) RADIATION DETECTOR AND RADIATION IMAGE TAKING DEVICE

(75) Inventors: Toshiyuki Sato, Kyoto (JP); Satoshi Tokuda, Kusatsu (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 09/671,829

(22) Filed: Sep. 27, 2000

(30) Foreign Application Priority Data

Feb. 28, 2000 (JP) ........................................ 2000-051862

(51) Int. Cl.⁷ ............................................. H01L 31/115
(52) U.S. Cl. ................................................. 250/370.13
(58) Field of Search ..................................... 250/370.13

(56) References Cited

U.S. PATENT DOCUMENTS 4,134,122 A * 1/1979 Moutou et al. ............. 257/473
5,693,947 A * 12/1997 Morton .................. 250/370.09
6,255,708 B1 * 7/2001 Sudharsanan et al. . 250/370.13

* cited by examiner

*Primary Examiner*—Constantine Hannaher
*Assistant Examiner*—Shun Lee
(74) *Attorney, Agent, or Firm*—Kanesaka & Takeuchi

(57) ABSTRACT

In a radiation detector, a polycrystalline film is formed by a closed spaced sublimation using a sintered material of at least one of a CdTe and CdZnTe powder. The CdTe or CdZnTe film has a thickness sufficient to catch radiation and a large area corresponding to a size of a supporting base plate, which can be obtained in a short time. Thus, a radiation detector and a radiation image taking device having a large area can be obtained.

12 Claims, 4 Drawing Sheets

RADIATION DETECTOR AND RADIATION IMAGE TAKING DEVICE

BACKGROUND OF THE INVENTION AND RELATED ART STATEMENT

The invention relates to a radiation detector and a radiation image taking device to be used in a field of medical treatment, industry or atomic energy, more particularly, a structure of a radiation sensitive semiconductor film to be provided to the radiation detector of this type, wherein radiation is directly converted into a carrier formed of a pair of electron and hole (hereinafter referred to "a pair of electron-hole").

A conventional radiation detector is structured such that a semiconductor film for producing a carrier formed of a pair of electron-hole sensitive to radiation to be detected is sandwiched by a bias electrode and detecting electrodes, and by applying a bias voltage between these electrodes, and the carriers, specifically, small number of carriers, produced in the semiconductor film are taken out from the detecting electrodes. As the radiation sensitive semiconductor film, it is desirable to select a semiconductor film having a good radiation conversion efficiency as much as possible. As the semiconductor film of this type, a monocrystalline semiconductor film is preferable, and especially monocrystals of CdTe and CdZnTe are used since they operate at a room temperature and have a high sensitivity.

However, the conventional radiation detector having the structure as described above has the following problems.

Since the radiation detector is used in place of an image intensifier for detecting X-rays in the medical treatment field, a radiation detector having a large area has been desired. However, it is very difficult to obtain a monocrystalline semiconductor film of CdTe or CdZnTe necessary for the radiation detector having the large area. Thus, there has been proposed a radiation detector having a large area by bonding together crystals with small areas in a tile style or arrangement to thereby obtain the radiation detector with the large area. However, it is very complicated to produce the radiation sensitive layer of the large area by bonding the monocrystals of the small area in the tile style, which results in poor work efficiency and poor economy. Also, since the carriers are not accumulated on joint portions for bonding the crystals, when an image is outputted, vertical stripes and horizontal stripes appear on the joint portions for bonding the crystals to thereby lower the quality of the picture image.

Further, in order to raise a catching rate of radiations, such as X-rays, although it is desired to make a radiation sensitive layer thick, since a growing speed of the monocrystals of CdTe and CdZnTe is very slow, it takes a long time to obtain a necessary thickness of the radiation sensitive layer, which results in a poor productivity of the radiation detector.

The present invention has been made in view of the above problems, and an object of the invention is to provide a radiation detector and radiation image taking device having a large area.

Another object of the invention is to provide a radiation detector and radiation image taking device as stated above, wherein a semiconductor film having a thickness sufficient for catching radiation can be produced in a short time.

Further objects and advantages of the invention will be apparent from the following description of the invention.

SUMMARY OF THE INVENTION

In order to attain the above objects, the present invention has the structures as follows.

According to a first aspect of the invention, in a radiation detector, a semiconductor film for producing a carrier formed of a pair of electron-hole sensitive to radiation to be detected is disposed between a bias electrode and detecting electrodes, and when a bias voltage is applied between the bias electrode and the detecting electrodes, the carrier produced in the semiconductor film can be taken out from the detecting electrodes, wherein the semiconductor film is a polycrystalline film of CdTe (cadmium telluride).

According to a second aspect of the invention, in a radiation detector, a semiconductor film for producing a carrier formed of a pair of electron-hole sensitive to radiations to be detected is disposed between a bias electrode and detecting electrodes, and when a bias voltage is applied between the bias electrode and the detecting electrodes, the carrier produced in the semiconductor film can be taken out from the detecting electrodes, wherein the semiconductor film is a polycrystalline film of CdZnTe (cadmium zinc telluride).

According to a third aspect of the invention, in a radiation detector, a semiconductor film for producing a carrier formed of a pair of electron-hole sensitive to radiations to be detected is disposed between a bias electrode and detecting electrodes, and when a bias voltage is applied between the bias electrode and the detecting electrodes, the carrier produced in the semiconductor film can be taken out from the detecting electrodes, wherein the semiconductor film has a laminate structure of a polycrystalline film of CdTe (cadmium telluride) and a polycrystalline film of CdZnTe (cadmium zinc telluride).

According to a fourth aspect of the invention, in the radiation detector of the third aspect, the polycrystalline film of CdZnTe (cadmium zinc telluride) constituting the semiconductor film is disposed on an incident side of radiation.

According to a fifth aspect of the invention, in the radiation detector of the third aspect, the polycrystalline film of CdTe (cadmium telluride) constituting the semiconductor film is disposed on an incident side of radiation.

According to a sixth aspect of the invention, in the radiation detector of any one of the first, third through fifth aspects of the invention, the polycrystalline film of CdTe (cadmium telluride) is obtained by heating a sintered material of CdTe power under a reduced pressure to sublimate.

According to a seventh aspect of the invention, in the radiation detector of any one of the second through fifth aspects of the invention, the polycrystalline film of CdZnTe (cadmium zinc telluride) is obtained by heating a mixed sintered material of CdTe power and ZnTe powder under a reduced pressure to sublimate.

According to an eighth aspect of the invention, in the radiation detector of any one of the second through fifth aspects of the invention, the polycrystalline film of CdZnTe (cadmium zinc telluride) is obtained by heating a mixed sintered material of CdTe power and Zn powder under a reduced pressure to sublimate.

According to a ninth aspect of the invention, in the radiation detector of any one of the first through eighth aspects, a carrier injection preventing layer for preventing the carrier from being injected to the semiconductor film is formed between the bias electrode and the semiconductor film and/or between the semiconductor film and the detecting electrodes.

According to a tenth aspect of the invention, in the radiation detector of the ninth aspect, the carrier injection preventing layer is an n-type or p-type semiconductor layer for making a hetero-junction between the semiconductor film and itself.

According to an eleventh aspect of the invention, in the radiation detector of the ninth aspect, the carrier injection preventing layer is made of a material capable of forming a Schottky barrier on an interface between the semiconductor film and itself.

According to a twelfth aspect of the invention, in the radiation detector according to any one of the first to eleventh aspects, the detecting electrodes are separately disposed on a one-dimension or two-dimensions, and the bias electrode is a single common electrode.

A thirteenth aspect of the invention is a radiation image taking device including the radiation detector according to the twelfth aspect; and a switching matrix board having a plurality of charge storage capacitors connected separately to the respective detecting electrodes, and a plurality of charge read-out switching elements connected to the respective charge storage capacitors.

Next, functions of the radiation detectors and the radiation image taking device of the invention will be explained.

In the radiation detector according to the first aspect of the invention, between the bias electrode and detecting electrodes, the polycrystalline film of CdTe is used as the semiconductor film for producing the carrier formed of a pair of electron-hole sensitive to the radiations to be detected, so that the semiconductor film can be made with a large area, and at the same time, a film thickness sufficient to catch the radiations can be obtained.

In the radiation detector according to the second aspect of the invention, between the bias electrode and detecting electrodes, the polycrystalline film of CdZnTe is used as the semiconductor film for producing the carrier formed of a pair of electron-hole sensitive to the radiations to be detected, so that the semiconductor film can be made with a large area, and at the same time, a film thickness sufficient to catch the radiation can be obtained. Further, since the polycrystalline film of CdZnTe doped with Zn has a high resistance to thereby have a sufficient band gap, a current leak between the detecting electrodes and the bias electrode can be suppressed.

In the radiation detector according to the third aspect of the invention, between the bias electrode and detecting electrodes, the semiconductor film for producing the carrier formed of a pair of electron-hole sensitive to the radiation to be detected is formed of polycrystalline films of CdTe and CdZnTe. The polycrystalline film of CdTe has a high film forming ratio to thereby form a film of a large area with a film thickness sufficient to catch the radiation in a short time. Also, since the CdZnTe polycrystalline film doped with Zn has a high resistance and a sufficient band gap, a current leak can be suppressed. In other words, since the semiconductor film has a laminate structure of two kinds of polycrystalline films, the semiconductor film is provided with characteristics of both films to thereby obtain detecting results of a high sensitivity.

In the radiation detector according to the fourth aspect of the invention, in the structure of the semiconductor film in the third aspect, by providing the polycrystalline film of CdZnTe of the high resistance on an incident side of the radiation, a current leak in a vertical direction between the detecting electrodes and the bias electrode can be suppressed. As a result, an image information having a large concentration resolving ability with an enlarged dynamic range can be obtained by the radiation detector.

In the radiation detector according to the fifth aspect of the invention, in the structure of the semiconductor film of the third aspect, the polycrystalline film of CdZnTe having the high resistance is disposed on a side of the detecting electrodes, i.e. opposite side to the incident side of the radiation. In case the detecting electrodes of the radiation detector are disposed in one-dimension or two-dimensions, a current leak between the adjacent detecting electrodes can be suppressed. As a result, when the radiation detector is used as the radiation image taking device to output an image, an image information having a high resolution where a space resolving power is raised can be obtained.

In the radiation detector according to the sixth aspect of the invention, since a sintered material of a CdTe power is heated under a reduced pressure to sublimate, a polycrystalline film of CdTe having a large area and a sufficient film thickness can be formed in a short time.

In the radiation detector according to the seventh aspect of the invention, a mixed sintered material of a CdTe power and a ZnTe powder is heated under a reduced pressure to sublimate, so that a polycrystalline film of CdZnTe having a large area, a sufficient film thickness, a high resistance and a sufficient band gap can be easily obtained in a short time.

In the radiation detector according to the eighth aspect of the invention, a mixed sintered material of a CdTe power and a Zn powder is heated under a reduced pressure to sublimate, so that a polycrystalline film of CdZnTe having a large area, a sufficient film thickness, a high resistance and a sufficient band gap can be easily obtained in a short time.

In the radiation detector according to the ninth aspect of the invention, since a carrier injection preventing layer for preventing carriers from being injected to the semiconductor film is provided between the bias electrode and the semiconductor film and/or between the semiconductor and detecting electrodes, when a voltage is applied to the bias electrode, a detecting effect of a high S/N ratio, i.e. signal to noise, can be obtained because leak carriers which do not contribute to sensitivity are not injected into the semiconductor film. Also, in case the carrier injection preventing layers are provided on both bias electrode side and detecting electrode side, injection of the carriers from the outside is completely prevented, and only pure carriers produced in the semiconductor film can be detected to thereby further improve the S/N radio.

In the radiation detector according to the tenth aspect of the present invention, by providing an n-type or p-type semiconductor layer for making a hetero-junction between the carrier injection preventing layer and the semiconductor film of the ninth aspect, when a voltage is applied to the bias electrode, carriers other than those produced in the semiconductor film are prevented from being injected into the semiconductor film.

In the radiation detector according to the eleventh aspect of the present invention, a material for forming a Schottky barrier is allowed to contact the semiconductor film, so that a Schottky barrier can be formed on an interface between the material and the semiconductor film to thereby prevent the carriers from the outside from being injected into the semiconductor film.

In the radiation detector according to the twelfth aspect of the invention, since the detecting electrodes are separated and disposed in one-dimension or two-dimensions, a one-dimensional or two-dimensional radiation detector can be obtained.

Since the radiation image taking device according to the thirteenth aspect of the invention includes the switching matrix board having a plurality of charge storage capacitors connected to the respective detecting electrodes of the radiation detector according to the twelfth aspect, and a plurality of charge readout switching elements connected to the respective charge storage capacitors, the radiation image taking device in one dimension or two dimensions can be obtained.

DETAILED DESCRIPTION OF THE PREFERRED EMBODIMENTS

Hereinunder, a structure and function of a first embodiment according to the invention are explained with reference to the accompanying drawings.

Figure 1:
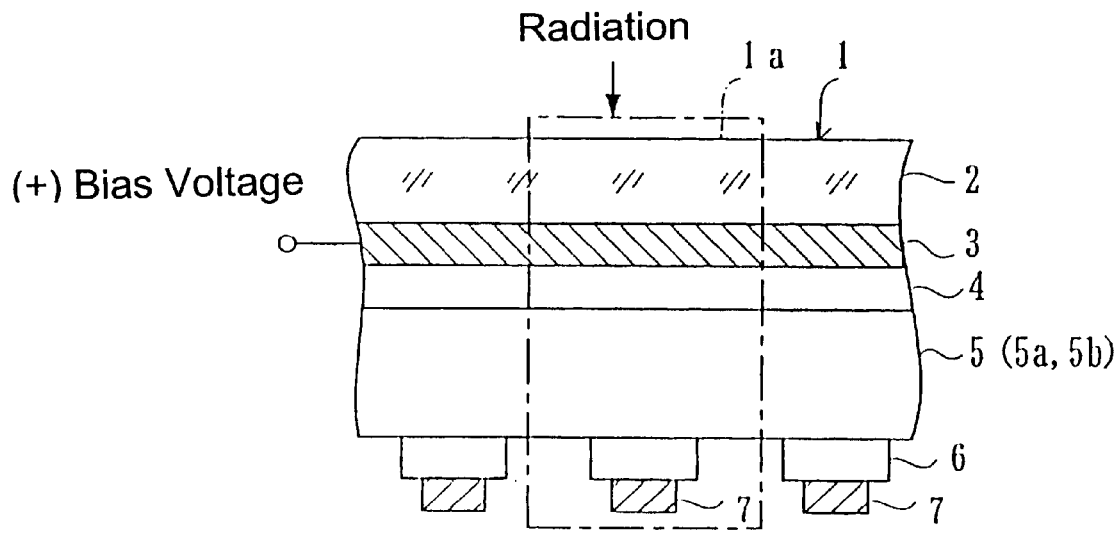
FIG. 1 is a sectional view showing a structure of a radiation detector of a first embodiment according to the present invention.

FIG. 1 is a sectional view showing the structure of the first embodiment of a radiation detector according to the present invention.

A radiation detector 1 has a laminate structure roughly including, in the order from a radiation incident side, a glass base plate, i.e. supporting base plate, 2; a common electrode 3 for applying a bias voltage formed on a surface, i.e. a lower surface in FIG. 1, of the glass base plate 2; a hole injection preventing layer 4 formed on a surface side, i.e. a lower surface in FIG. 1, of the common electrode 3; a semiconductor film 5 for producing a carrier formed of a pair of electron-hole sensitive to radiation to be detected; electron injection preventing layers 6 formed on a surface, i.e. a lower surface in FIG. 1, of the semiconductor film 5; and detecting electrodes 7 for collecting the carriers formed on the surfaces, i.e. lower surfaces in FIG. 1, of the electron injection preventing layers 6. In the radiation detector 1 according to the first embodiment, radiation to be detected enters from a side of the common electrode 3 of the glass base plate 2, and a positive bias voltage is applied to the common electrode 3. The common electrode 3 corresponds to a bias electrode in the present invention. Also, the hole injection preventing layer 4 and the electron injection preventing layer 6 correspond to carrier injection preventing layers in the present invention.

The supporting base plate 2 may be formed of, for example, a ceramic. ($Al_2O_3$, AlN) or a silicon in addition to the glass.

The common electrode 3 and detecting electrodes 7 are made of, for example, ITO (indium-tin oxide), and a conductive material, such as Au or Pt. As the hole injection preventing layer 4, CdS (cadmium sulfide) film forming an n-type layer can be mentioned. Also, as the electron injection preventing layer 6, $Sb_2Te_3$ (antimony telluride) and $Sb_2S_3$ (antimony sulfate) for forming a p-type layer can be mentioned.

In the first embodiment, the semiconductor film 5 is a CdTe film 5b of a semiconductor polycrystalline film obtained by positioning a sintered material of CdTe powder close to the glass base plate 2 and heating the same under a reduced pressure to sublimate. That is, since the CdTe film 5b is obtained by the method (hereinafter referred to as "closed spaced sublimation") as described above, it is possible to form in a short time the CdTe film 5b of a large area having a sufficient film thickness for catching radiation. Incidentally, the CdTe film 5b in the first embodiment has a thickness, for example, of about several hundreds $\mu$m.

Also, the film may be formed by a sputtering method, CVD method, a chemical deposit method or the like, without limiting to the closed spaced sublimation.

Next, operations of the radiation detector according to the first embodiment are explained.

In case of the radiation detector 1 of the first embodiment, as shown in FIG. 1, a positive bias voltage is applied to the common electrode 3. As the radiation to be detected enters from an upper side of the glass base plate 2 toward the CdTe film 5b, a carrier formed of a pair of electron-hole is produced at the CdTe film 5b having an i (intrinsic)-type semiconductor structure.

Also, by applying a positive bias voltage to the common electrode 3 with respect to the detecting electrodes 7, an n-type hole injection preventing layer 4 disposed on the side of the common electrode 3 and p-type electron injection preventing layers 6 disposed on the side of the detecting electrodes 7 are in a reversed bias state to thereby prevent the hole and electron from being injected to the CdTe film 5b. In other words, in the first embodiment, since holes and electrons other than the carriers (electrons) produced in an inner portion of the CdTe film 5b are prevented from being injected, an S/N, i.e. signal to noise, ratio can be increased.

Also, in the hole injection preventing layer 4, an n-type semiconductor layer can be formed by using a CdS material, and at the same time, since the CdTe film 5b forms the i-type semiconductor layer, the hole injection preventing layer 4 and the semiconductor layer 5 form a good hetero-junction. Also, a p-type semiconductor layer can be formed to the electron injection preventing layer 6 on the side of the detecting electrodes 7 by using the above-described material forming the hetero-junction.

Incidentally, the carrier injection preventing layer is not limited to the above-described hole injection preventing layer 4 and the electron injection preventing layer 6, which form the hetero-junction. The carrier injection preventing layer may be made of a conductive material, such as ITO (indium-tin oxide), which forms a Schottky barrier between the common electrode 3 and the CdTe film 5b and between the detecting electrodes 7 and the CdTe film 5b, respectively.

A second embodiment is explained. In the second embodiment, the difference with respect to the first embodiment resides in that the semiconductor film 5 of the radiation detector 1 as shown in FIG. 1 is formed of a semiconductor polycrystalline film, i.e. CdZnTe.

In the second embodiment, the CdZnTe film 5a is obtained by the closed spaced sublimation using a mixed sintered material of a CdTe powder and a ZnTe (zinc telluride) powder, or a mixed sintered material of a CdTe powder and a Zn (zinc) powder. More specifically, with the closed spaced sublimation, the CdZnTe film 5a having a large area as well as a thickness sufficient for catching radiation can be obtained in a short time. Also, since the CdZnTe film 5a obtained by doping CdTe with Zn has a wide band gap, it has a high resistance. In case a current leaks between the common electrode 3 and the detecting electrodes 7, and the detecting electrodes 7 are disposed in one-dimension (one direction) or two-dimensions (two directions), the current leak between the adjacent detecting electrodes 7 can be suppressed, respectively.

Incidentally, in case of the CdZnTe film 5a, the thickness thereof is about several hundreds μm.

Since the other structures and operations are the same as those in the first embodiment, explanations except the above are omitted.

A third embodiment is explained. In the third embodiment, differences from the preceding embodiments are as follows.

Figure 2:
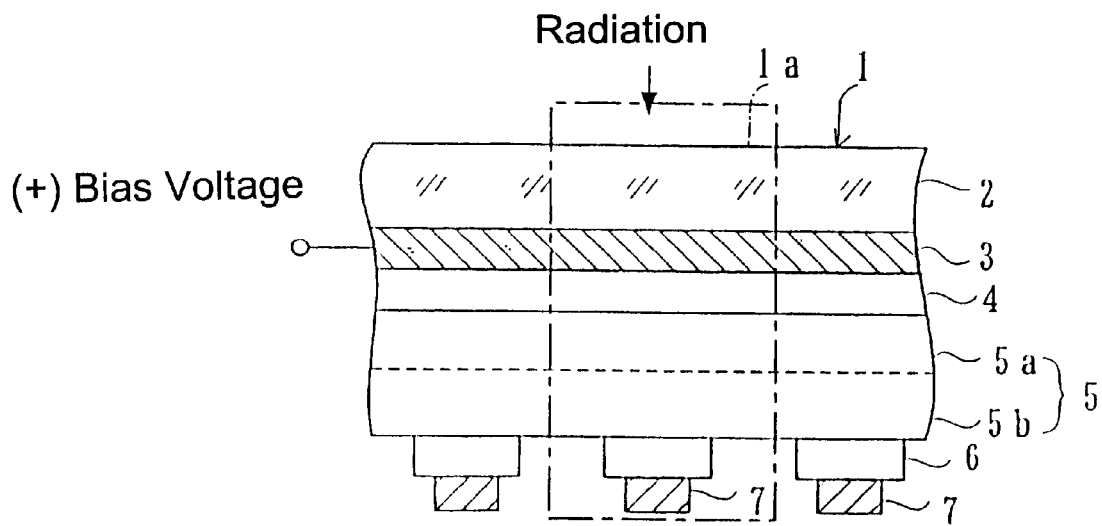
FIG. 2 is a sectional view showing a structure of a radiation detector of a third embodiment according to the present invention.

As shown in FIG. 2, the semiconductor film 5 of the radiation detector 1 has a two-layer structure including the CdZnTe film 5a and CdTe film 5b in the order from the incident side of the radiation.

In the third embodiment, the semiconductor film 5 of the two-layer structure is formed of the CdZnTe film 5a of a polycrystalline film obtained by the closed spaced sublimation using a mixed sintered material of the CdTe power and a ZnTe or Zn powder, and the CdTe film 5b of a polycrystalline film obtained by the closed spaced sublimation using a sintered material of the CdTe power.

In the semiconductor film 5 of the two-layer structure, since the CdZnTe film 5a has a high resistance, a current leak is suppressed. On the other hand, since the CdTe film 5b has a high film making ratio, a film of a large area is obtained in a short time, and has a thickness sufficient to catch radiation. Since the laminate structure is obtained by laminating two kinds of the polycrystalline semiconductor films, advantages of the both films are obtained. Further, in the third embodiment, the current leak between the detecting electrodes 7 and the common electrode 3 is suppressed. In other words, since the current leak is very little, fine detecting signals can be identified. Thus, the radiation detector 1 of the third embodiment has a structure suitable for obtaining an image having a large concentration resolving ability with an enlarged dynamic range.

Incidentally, the thickness of the CdZnTe film 5a is, for example, in the order of several μm to several tens of μm, and the thickness of the CdTe film 5b is, for example, in the order of several tens of μm to several hundreds of μm.

Incidentally, since the other structure and operations of the third embodiment are the same as those of the preceding embodiments, explanations other than the above are omitted.

A fourth embodiment is explained. In the fourth embodiment, points different from the third embodiment as shown in FIG. 2 are as follows.

The semiconductor film 5 of the radiation detector 1 has a two-layer structure, wherein the CdTe film 5b and the CdZnTe film 5a of the semiconductor polycrystalline films produced by the closed spaced sublimation are laminated in this order from the incident side of the radiations.

Usually, similar to the third embodiment as shown in FIG. 2, in case the detecting electrodes 7 are separated and disposed in one-dimensional or two-dimensional manner, a current leak is liable to occur between the adjacent detecting electrodes 7. However, in the fourth embodiment, since the high resistant CdZnTe film 5a is provided on the side of the detecting electrodes 7, the current leak between the adjacent detecting electrodes 7 can be suppressed. In other words, in a radiation image taking device using the radiation detector 1 according to the fourth embodiment, an image information having a high resolution degree where a space resolving power is raised can be obtained. Also, the current leak between the detecting electrodes 7 and the common electrode 3 can be suppressed.

Incidentally, since the other structures and operations of the fourth embodiment are the same as those of the preceding embodiments, explanations other than the above are omitted.

Next, an embodiment of a radiation image taking device using the radiation detector 1 will be explained, as a fifth embodiment.

Figure 3:
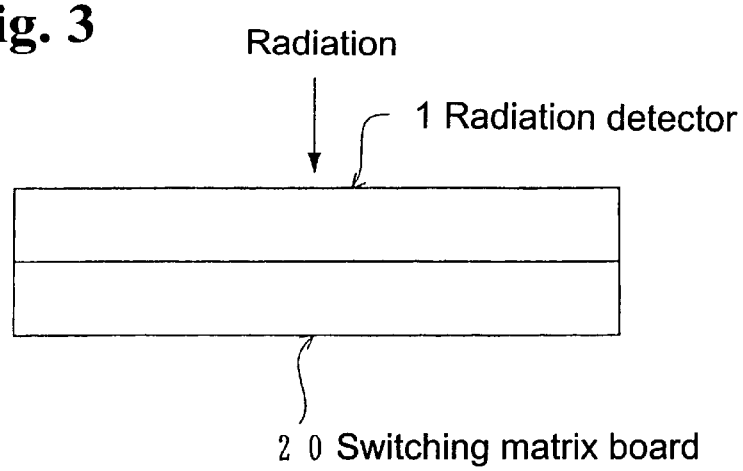
FIG. 3 is a schematic front view showing a combined state of the radiation detector and a switching matrix board of a radiation image taking device.

FIG. 3 is a schematic view showing a combined state of the radiation detector 1 and a switching matrix board 20.

The radiation image taking device according to the fifth embodiment is structured such that the radiation detector 1 obtained in each of the respective embodiments and the switching matrix board 20 for accumulating-reading out the obtained carriers are combined in a thickness direction. In the radiation detector 1, carriers are produced from the incident radiation to be detected by a direct conversion system, and at the same time, the carriers collected at every element in the switching matrix board 20 are accumulated in every element to thereby read-out as an electric signal. Since the radiation detector 1 has already been described above, structures of the respective portions of the switching matrix board 20 are specifically explained.

Figure 4:
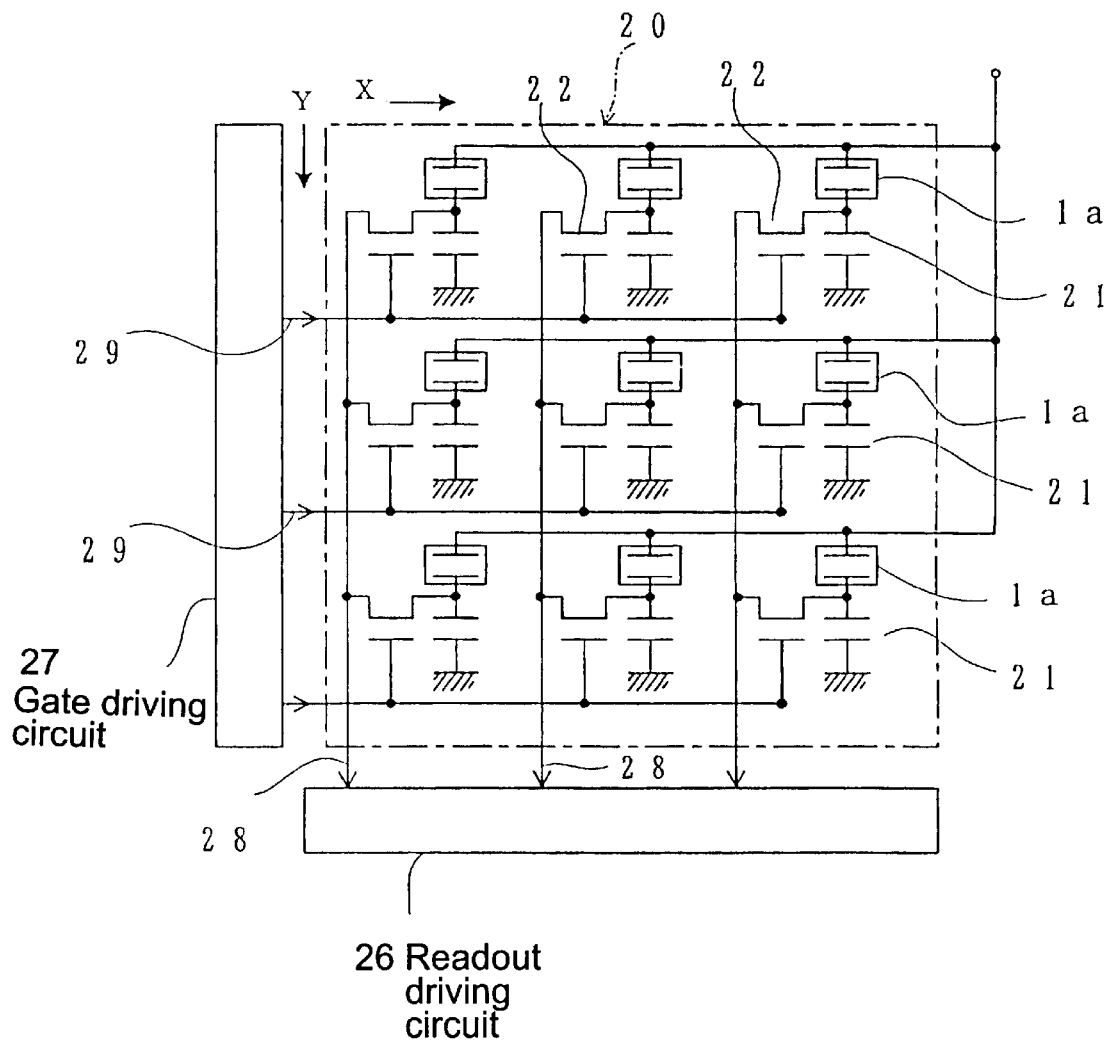
FIG. 4 is an electric circuit showing an equivalent circuit of the switching matrix board.

The switching matrix board 20 as shown in FIG. 4 is provided, for each detecting element 1a (refer to FIGS. 1 and 2), with a condenser 21 as a charge storage capacity and a thin film transistor (TFT) 22 as a switching element. Incidentally, in FIG. 4, as a matter of convenience, the switching matrix board 20 is formed of nine pixels or picture elements in total, i.e. 3 in height and 3 in width. However, actually, in the supporting base plate 2, about 1000–3000 in height×about 1000–3000 in width of the detecting elements 1a are disposed in two dimensional manner according to the necessary picture elements. Also, in the switching matrix board 20, the same numbers of the condensers 21 and the thin film transistors 22 as the number of the picture elements are disposed in two dimensions with the same matrix structure.

Figure 5:
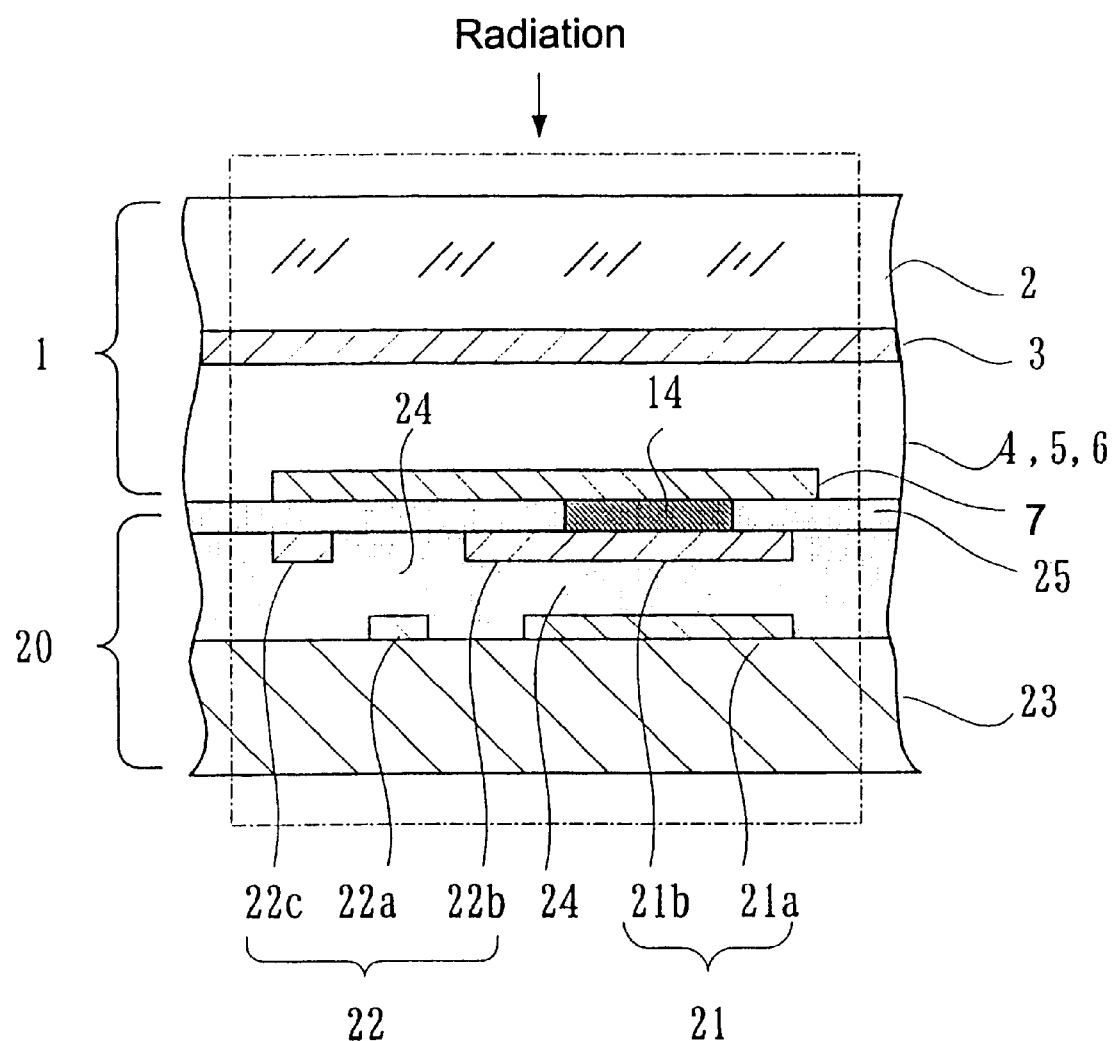
FIG. 5 is a sectional view showing a detecting element of the radiation detector of the embodiment.

A specific structure of the condensers 21 and the thin film transistors 22 in the switching matrix board 20 is shown in FIG. 5. That is, a laminate structure includes an earth side electrode 21a of the condenser 21 disposed on a surface of an insulative supporting board (circuit board) 23, a connecting side electrode 21b of the condenser 21 situated through an insulative film 24 and provided on a gate electrode 22a of the thin film transistor 22, a source electrode 22b of the thin film transistor 22, and a drain electrode 22c. Also, the uppermost surface side is covered by an insulative protection film 25. Further, the connecting side electrode 21b and the source electrode 22b are connected as one piece and are simultaneously formed. As the insulative film 24 for constituting both a capacity insulative film of the condenser 21 and a gate insulative film of the thin film transistor 22, for example, a plasma SiN film is used. The switching matrix board 20 is produced by using a thin film forming technique or a fine work technique to be used for making an active matrix board for a liquid crystal display.

Also, in a state where the detecting electrodes 7 and the connecting side electrodes 21b of the condensers 21 are aligned with each other, both boards 1 and 20 are bonded together by heating under a pressure with an anisotropic conductive film (ACF) containing conductive particles, such as silver particles, and having a conductivity only in a thickness direction therebetween, so that the both boards 1 and 20 are mechanically combined, and at the same time, the detecting electrodes 7 and the connecting side electrodes 21b are electrically connected by an intervening conductive portion 14. Incidentally, instead of the anisotropic conductive film (ACF), an anisotropic conductive paste (ACP) or patterned conductive film may be used.

Further, the switching matrix board 20 is provided with a readout driving circuit 26 and a gate driving circuit 27. The readout driving circuit 26, as shown in FIG. 4, is connected to each readout wiring, i.e. readout address line, 28 in a vertical (Y) direction for connecting the drain electrodes of the thin film transistors 22 in the same column. The gate driving circuit 27 is connected to each readout wiring, i.e. gate address line, 29 in a horizontal (X) direction for connecting the gate electrodes of the thin film transistors 22 in the same line. Incidentally, though not shown, in the readout driving circuit 26, a preamplifier, i.e. charge-voltage converter, is connected to each of the readout wirings 28, respectively.

As described above, the switching matrix board 20 is connected to the readout driving circuit 26 and the gate driving circuit 27. However, the switching matrix board 20 may be connected to an integrated structure where the readout driving circuit 26 and the gate driving circuit 27 are formed integrally.

Next, radiation detecting operations by the radiation image taking device wherein the radiation detector 1 and the switching matrix board 20 are combined will be explained.

As radiation to be detected enters from an upper side of the glass base plate 2 toward the semiconductor film 5, carriers are produced in the semiconductor film 5. Since the thin film transistor 22 is turned off till the next readout time, the produced carriers are stored in the condenser 21 as a charge.

In case of the switching matrix board 20, a readout scan signal is sent to the gate driving circuit 27 and the readout driving circuit 26. Identification of the respective detecting elements 1a is carried out based on addresses, for example 0 to 1023, assigned to the respective detecting elements 1a along the column and line in the X and Y directions in order, and take-out scan signals are the signals for designating the respective addresses in the X direction and in the Y direction.

According to the scan signals in the Y direction, as a readout voltage is applied to the readout wirings 28 in the Y direction from the gate driving circuit 27, the respective elements 1a in the lines are selected. And, when the readout driving circuit 26 is switched according to the scan signal in the X direction, the charges accumulated in the condensers 21 are read out in order as electric signals, i.e. picture element or pixel signals, from the readout driving circuit 26 through the thin film transistors 22 corresponding to the detecting elements, i.e. picture elements, 1a corresponding to the selected line and column. The readout picture element signals are sent to CRT, i.e. cathode ray tube, or a display device using a liquid crystal or PDP after they are subjected to an appropriate image process to be displayed as a two-dimensional image. p Next, the closed spaced sublimation, as one example, for producing the radiation detectors 1 of the respective embodiments is explained with reference to formation of the CdTe film 5b of the semiconductor film 5 in the present invention.

The common electrode 3 and the hole injection preventing layer 4 are laminated on a surface of the glass base plate 2, i.e. supporting base plate, by a sputtering or deposition. Incidentally, as the supporting base plate, it is preferable to use a base plate which absorbs less radiation to be detected.

Figure 6:
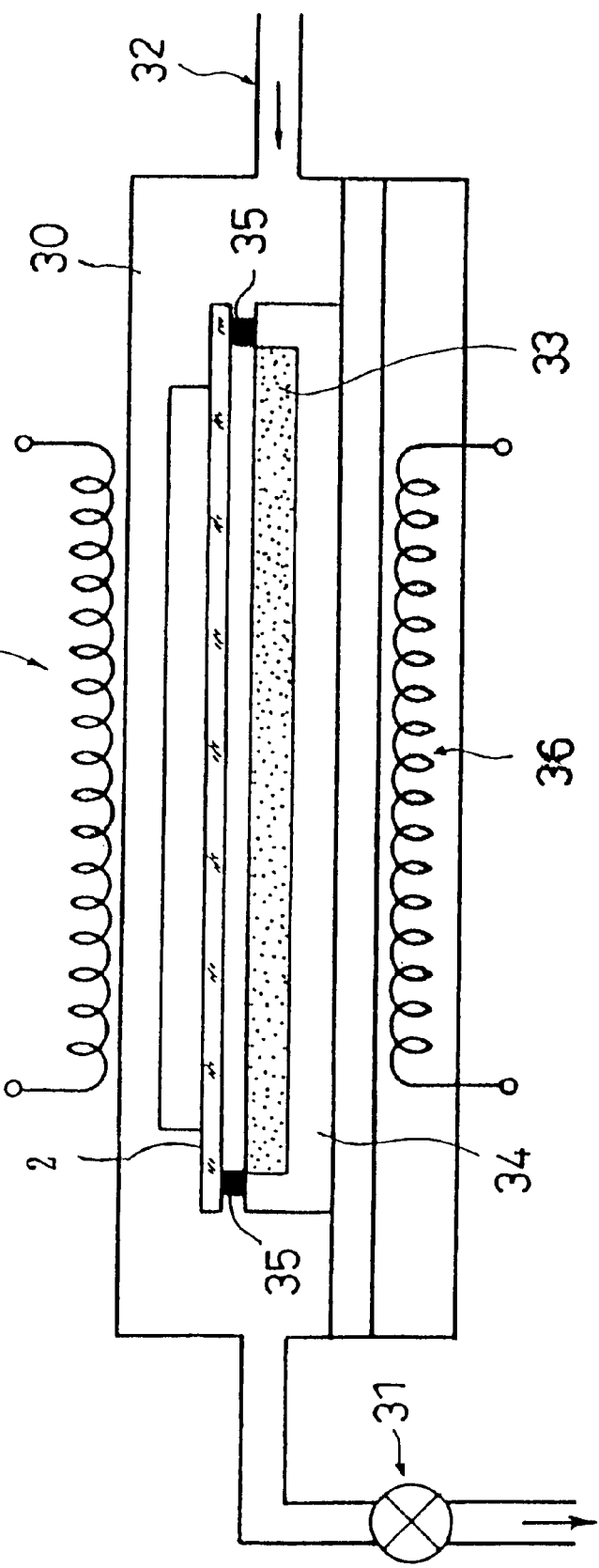
FIG. 6 is a drawing showing a state when a semiconductor crystalline film is formed on a detecting base plate of the embodiment by a proximity sublimation method.

Next, as the semiconductor film 5, the CdTe film 5b is laminated thereon by the closed spaced sublimation. In case the film is formed by the closed spaced sublimation, as shown in FIG. 6, air in a chamber is exhausted by a vacuum pump 31 to be a reduced-pressure atmosphere, and at the same time, a sintered material 33 of CdTe powder as a material of the semiconductor film 5 is disposed to face a surface of the glass base plate laminated with the common electrode 3 and the hole injection preventing film 4 in a deposition chamber 30 to which a carrier gas is supplied through a flow path 32. The sintered material 33 of the CdTe power is placed on a lower susceper 34 and the glass base plate 2 is disposed thereon through spacers 35 so that the deposition surface of the glass base plate 2 faces downward. A space between the glass base plate 2 and the sintered material 33 is set to be in the order of several millimeters.

Then, when the sintered material 33 of the CdTe powder is heated by upper and lower heaters 37, 36, the sintered material 33 of the CdTe power directly becomes a gas, i.e. is sublimated not through a liquid stage, to adhere to the surface of the glass base plate 2 and form the semiconductor film 5 of a semiconductor 14 polycrystalline film.

Incidentally, when a temperature in the film forming process is set, for example, in the order of several hundreds of ° C., the CdTe film 5b can be formed and laminated.

Then, after a semiconductor layer for the electron injection preventing layer 6 is laminated by the sputtering method or deposition method on the semiconductor film 5 formed on the surface of the glass base plate 2, the electron injection preventing layers 6 can be formed through patterning. Thereafter, a metal film for the detecting electrodes 7 is laminated thereon and patterned to thereby obtain the detecting electrodes 7 and finally the radiation detector 1.

Then, the obtained radiation detector 1 and the switching matrix board 20 separately prepared are combined by using an anisotropic conductive film (ACF) or the like to thereby obtain a two-dimensional radiation image taking device.

Incidentally, in case the CdZnTe film 5a is formed by the closed spaced sublimation, the same procedure as that for the CdTe film is carried out except for changing a sintered material.

However, in case of forming the CdZnTe film, characteristics thereof can be controlled by changing a concentration of Zn in the film. More specifically, in case the radiation detector 1 and the switching matrix board 20 are combined in a stage of designing of the radiation image forming device, the concentration of Zn is determined by considering beforehand a current leak caused by a relationship with the condenser 21, the thin film transistor 22 or the like. For example, in case the current leak is suppressed in the above-described embodiments, the concentration of Zn is controlled in a range of several percents to several tens of percent.

Also, in case the semiconductor film 5 has a two-layer structure including the CdTe film 5b and the CdZnTe film 5a, the film 5 is formed such that after either of both films is formed, the other film is formed.

As described above, in case the semiconductor film 5 is formed by the closed spaced sublimation, the semiconductor film 5 having a large area and a film thickness sufficient for catching radiation can be obtained in a short time.

The present invention is not limited to the above embodiments, and can be modified as follows.

Although the present invention has been applied to the one-dimensional or two-dimensional radiation detector 1 in the above embodiments, the invention may be applied to a radiation detector having only one detecting element 1a with a large square area of, for example, several tens of centimeters.

As apparent from the above descriptions, according to the first aspect of the invention, since the polycrystalline film of CdTe is used between the bias electrode and detecting electrodes as the semiconductor film for producing a carrier formed of a pair of electron-hole sensitive to the radiation to be detected, a radiation detector with a large area can be easily produced, and at the same time, the thickness of the semiconductor film sufficient to catch the radiation can be obtained.

According to the second aspect of the invention, since the polycrystalline film of CdZnTe is used between the bias electrode and detecting electrodes as the semiconductor film for producing a carrier formed of a pair of electron-hole sensitive to radiations to be detected, the radiation detector with a large area can be easily produced, and at the same time, a semiconductor film thickness sufficient to catch the radiation can be obtained. Further, since the polycrystalline film of CdZnTe has a high resistance, a current leak between the detecting electrodes and the bias electrode can be suppressed.

According to the third aspect of the invention, the semiconductor film for producing a carrier formed of a pair of electron-hole sensitive to radiations to be detected is formed of polycrystalline films of CdTe and CdZnTe between the bias electrode and detecting electrodes. Since the polycrystalline film of CdTe has a high film making ratio, a semiconductor film of a large area can be produced in a short time, and a semiconductor film thickness sufficient to catch radiations can be obtained. Also, since the polycrystalline film of CdZnTe has a high resistance, a current leak can be suppressed. In other words, in case the semiconductor film has the laminate structure of the above-stated two kinds of polycrystalline films, the semiconductor film has advantages of both films, so that the radiation detector having the large area, the excellent productivity and good characteristics can be obtained.

According to the fourth aspect of the invention, in the semiconductor film of the third aspect, since the polycrystalline film of CdZnTe having the high resistance is disposed on a side of the bias electrode, i.e. incident side of the radiation, the current leak between the detecting electrodes and the bias electrode can be suppressed. As a result, the radiation detector having a large concentration resolving ability over an enlarged dynamic range can be obtained.

According to the fifth aspect of the invention, in the structure of the semiconductor film of the third aspect, the polycrystalline film of CdZnTe having the high resistance is disposed on the side of the detecting electrodes, i.e. opposite side to the incident side of the radiation. In case the detecting electrodes of the radiation detector are disposed in one-dimensional or two-dimensional manner, a current leak between the adjacent detecting electrodes can be suppressed. As a result, a radiation detector having a high space resolving ability can be obtained.

According to the sixth aspect of the invention, since the sintered material of CdTe powder is heated to sublimate under a reduced pressure, a polycrystalline film of CdTe having a large area and a sufficient thickness can be formed in a short time.

According to the seventh aspect of the invention, a mixed sintered material of the CdTe power and the ZnTe powder is heated to sublimate under a reduced pressure, so that a polycrystalline film of CdZnTe having a large area, a high resistance and a sufficient film thickness can be easily obtained in a short time.

According to the eighth aspect of the invention, a mixed sintered material of the CdTe power and Zn power is heated to sublimate under a reduced pressure, so that a polycrystalline film of CdZnTe having a large area, a high resistance and a sufficient film thickness can be easily obtained in a short time.

According to the ninth aspect of the invention, since the carrier injection preventing layer for preventing carriers from being injected to the semiconductor film is provided between the bias electrode and the semiconductor film and/or between the semiconductor film and detecting electrodes, when a voltage is applied to the bias electrode, an S/N, i.e. signal to noise, ratio can be improved because the carriers which do not contribute to an improvement of sensitivity are not injected into the semiconductor film.

According to the tenth aspect of the invention, as the carrier injection preventing layer of the ninth aspect, the n-type or p-type semiconductor layer for making a heterojunction is used between the semiconductor film and the bias electrode or between the semiconductor film and the detecting electrodes, so that the same effects as those in the ninth aspect can be obtained.

According to the eleventh aspect of the invention, since the carrier injection preventing layer is formed by using the material for forming a Schottky barrier between the semiconductor film and the bias electrode or between the semiconductor film and the detecting electrodes, the same effects as those in the ninth aspect can be obtained.

According to the twelfth aspect of the invention, since the detecting electrodes are separated and disposed in one dimensional or two-dimensional manner, a radiation detector having a large area of the one dimensional or the two dimensional manner can be obtained.

According to the thirteenth aspect of the invention, since a plurality of charge storage capacitors connected to the respective detecting electrodes of the radiation detector according to the twelfth aspect and a switching matrix board including a plurality of charge readout switching elements connected to the respective charge storage capacitors, are provided, a radiation image taking device with a large area in one dimensional or two dimensional manner can be obtained.

While the invention has been explained with reference to the specific embodiments of the invention, the explanation is illustrative and the invention is limited only by the appended claims.

What is claimed is:

1. A radiation detector comprising:
   a substrate;
   a bias electrode deposited on the substrate;
   a semiconductor film for producing a carrier formed of a pair of electron-hole sensitive to radiation to be detected, said semiconductor film being deposited on the bias electrode on the substrate and formed of at least one polycrystalline film made of a material selected from the group consisting of CdTe and CdZnTe; and
   a plurality of detecting electrodes formed on the semiconductor film so that when a bias voltage is applied between the bias electrode and one of the detecting electrodes, said carrier produced in the semiconductor film is taken out from said one of the detecting electrodes.

2. A radiation detector according to claim 1, wherein said semiconductor film is formed of a CdTe polycrystalline film.

3. A radiation detector according to claim 1, wherein said semiconductor film is formed of a CdZnTe polycrystalline film.

4. A radiation detector according to claim 1, wherein said semiconductor film is formed of a CdTe polycrystalline film and a CdZnTe polycrystalline film of CdZnTe laminated together.

5. A radiation detector according to claim 4, wherein said CdZnTe polycrystalline film is located on an incident side of radiation.

6. A radiation detector according to claim 4, wherein said CdTe polycrystalline film is located on an incident side of radiation.

7. A radiation detector according to claim 1, further comprising a carrier injection preventing layer for preventing the carrier from being injected into the semiconductor film, said carrier injection preventing layer being formed at least one of a portion between the bias electrode and the semiconductor film and a portion between the semiconductor film and the detecting electrodes.

8. A radiation detector according to claim 7, wherein said carrier injection preventing layer is one of an n-type semiconductor layer and a p-type semiconductor layer for forming a hetero-junction between the semiconductor film and the carrier injection preventing layer.

9. A radiation detector according to claim 7, wherein said carrier injection preventing layer is made of a material for forming a Schottky barrier on an interface between the semiconductor film and the carrier injection preventing layer.

10. A radiation detector according to claim 1, wherein said detecting electrodes are separately disposed in a lateral direction, and said bias electrode is a single common electrode.

11. A radiation detector according to claim 1, wherein said radiation detector consists essentially of said substrate, said bias electrode formed on the substrate, a hole injection preventing layer formed on the bias electrode, said semiconductor film formed on the hole injection preventing layer, a plurality of electron injection preventing layers formed on the semiconductor film, and said detecting electrodes formed on the respective electron injection preventing layers.

12. A radiation image taking device comprising:

said radiation detector according to claim 10; and a switching matrix board including a plurality of charge storage capacitors connected to the respective detecting electrodes of the radiation detector, and a plurality of charge readout switching elements connected to the respective charge storage capacitors.

* * * * *